USO10663785B2

United States Patent
Honda et al.

(10) Patent No.: US 10,663,785 B2
(45) Date of Patent: May 26, 2020

(54) INFORMATION PROCESSING APPARATUS AND METHOD OF MANUFACTURING INFORMATION PROCESSING APPARATUS

(71) Applicant: Fujitsu Client Computing Limited, Kanagawa (JP)

(72) Inventors: Shuji Honda, Kawasaki (JP); Wakana Sato, Kawasaki (JP)

(73) Assignee: FUJITSU CLIENT COMPUTING LIMITED, Kanagawa (JP)

( * ) Notice: Subject to any disclaimer, the term of this patent is extended or adjusted under 35 U.S.C. 154(b) by 0 days.

(21) Appl. No.: 16/393,724

(22) Filed: Apr. 24, 2019

(65) Prior Publication Data

US 2019/0250453 A1 Aug. 15, 2019

Related U.S. Application Data

(63) Continuation of application No. PCT/JP2017/038089, filed on Oct. 20, 2017.

(30) Foreign Application Priority Data

Dec. 12, 2016 (JP) .................................. 2016-240474

(51) Int. Cl.
*G02F 1/1333* (2006.01)
*G06F 1/16* (2006.01)
(Continued)

(52) U.S. Cl.
CPC ...... *G02F 1/133308* (2013.01); *G02F 1/1333* (2013.01); *G02F 1/1345* (2013.01);
(Continued)

(58) Field of Classification Search
CPC ............. G02F 1/133308; G02F 1/1333; G02F 1/1345; G02F 2001/133334;
(Continued)

(56) References Cited

U.S. PATENT DOCUMENTS 6,411,353 B1 * 6/2002 Yarita ............... G02F 1/133308
  349/150
7,379,128 B2 * 5/2008 Tsubokura .......... G02F 1/13394
  349/58
(Continued)

FOREIGN PATENT DOCUMENTS

JP 2005-215185 A 8/2005
JP 2006-058836 A 3/2006
(Continued)

OTHER PUBLICATIONS

International Search Report issued in corresponding International Application No. PCT/JP2017/038089 dated Jan. 16, 2018 (5 pages).

*Primary Examiner* — Abhishek M Rathod
(74) *Attorney, Agent, or Firm* — Osha Liang LLP

(57) ABSTRACT

An information processing apparatus includes: a conductive housing; a display fitted into and fixed to the housing; one or more display support members disposed between the display and the housing where the one or more display support members include a display support member provided with a bonding region on part of a surface of the display support member that is in contact with the housing and is fixed to the housing via a bonding member in the bonding region; and a flexible circuit board including a grounding pattern where the flexible circuit board is disposed such that the grounding pattern is in contact with the housing at a non-bonding region on the surface of the display support member and part of the flexible circuit board that includes the grounding pattern is held between the display support member and the housing.

6 Claims, 7 Drawing Sheets

(51) Int. Cl.
*H05K 1/02* (2006.01)
*G06F 1/18* (2006.01)
*H05K 7/12* (2006.01)
*H05K 5/02* (2006.01)
*H05K 7/14* (2006.01)
*G02F 1/1345* (2006.01)
*G09F 9/00* (2006.01)

(52) U.S. Cl.
CPC .............. *G06F 1/16* (2013.01); *G06F 1/1616* (2013.01); *G06F 1/18* (2013.01); *G09F 9/00* (2013.01); *H05K 1/0215* (2013.01); *H05K 5/02* (2013.01); *H05K 7/12* (2013.01); *H05K 7/14* (2013.01); *G02F 2001/133314* (2013.01); *G02F 2001/133325* (2013.01); *G02F 2001/133334* (2013.01); *G02F 2202/28* (2013.01)

(58) Field of Classification Search
CPC ..... G02F 2202/28; G02F 2001/133314; G02F 2001/133325; G09F 9/00; G06F 1/18; G06F 1/16; G06F 1/1616; G06F 1/1686; G06F 1/1656; G06F 1/1637; H05K 2201/10128; H05K 1/028; H05K 7/14; H05K 5/02; H05K 7/12; H05K 1/0215
See application file for complete search history.

(56) References Cited

U.S. PATENT DOCUMENTS

| | | | | |
|---|---|---|---|---|
| 7,606,023 | B2* | 10/2009 | Konno | G06F 1/1637 361/679.02 |
| 8,432,674 | B2* | 4/2013 | Shirasaka | G06F 1/1656 349/58 |
| 10,340,581 | B2* | 7/2019 | Lee | H01Q 5/371 |
| 2002/0179313 | A1* | 12/2002 | Hirai | H01R 24/44 174/34 |
| 2005/0116868 | A1* | 6/2005 | Shikata | H01R 9/0407 343/745 |
| 2006/0040520 | A1 | 2/2006 | Moh | |
| 2006/0181853 | A1* | 8/2006 | Jeong | H05K 5/02 361/704 |
| 2008/0174730 | A1* | 7/2008 | Lee | G02B 6/0065 349/149 |
| 2009/0115331 | A1 | 5/2009 | Kunimoto et al. | |
| 2011/0111807 | A1 | 5/2011 | Kido | |
| 2013/0027630 | A1 | 1/2013 | Muraoka | |
| 2013/0082580 | A1* | 4/2013 | Ohishi | H04M 1/0266 312/7.2 |
| 2014/0111388 | A1* | 4/2014 | Di Nallo | H01Q 1/2266 343/702 |
| 2019/0171253 | A1* | 6/2019 | Hara | G06F 1/1637 |

FOREIGN PATENT DOCUMENTS

| | | |
|---|---|---|
| JP | 2007-086408 A | 4/2007 |
| JP | 2009-116072 A | 5/2009 |
| JP | 2011-099993 A | 5/2011 |
| JP | 2011-257654 A | 12/2011 |
| JP | 2016-062016 A | 4/2016 |
| WO | 2011/129153 A1 | 10/2011 |

* cited by examiner

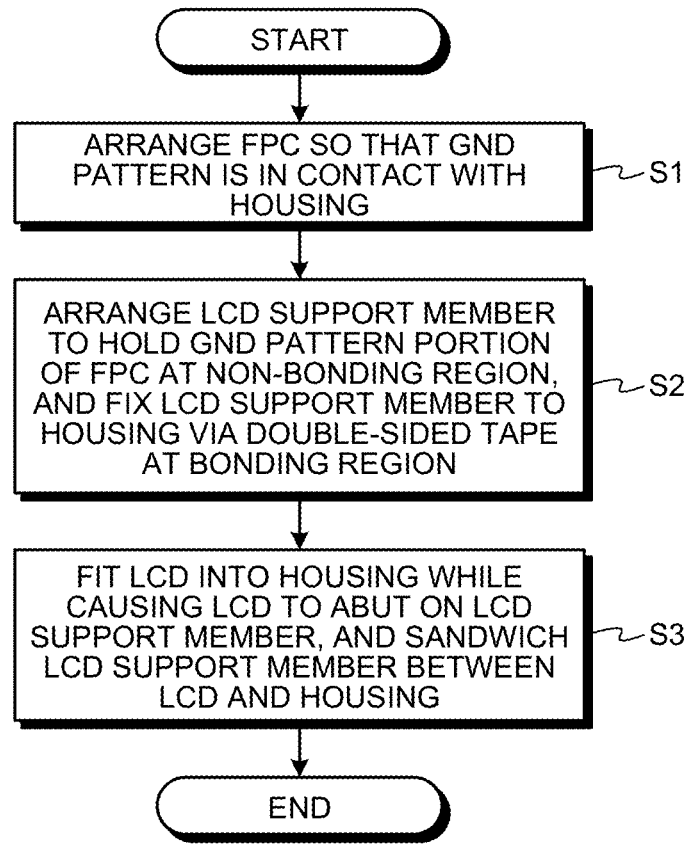

INFORMATION PROCESSING APPARATUS AND METHOD OF MANUFACTURING INFORMATION PROCESSING APPARATUS

CROSS-REFERENCE TO RELATED APPLICATIONS

This application is a continuation of PCT International Application No. PCT/JP2017/038089 filed on Oct. 20, 2017, which claims the benefit of priority from Japanese Patent Application No. 2016-240474 filed on Dec. 12, 2016, the entire contents of which are incorporated herein by reference.

FIELD

Embodiments described herein relate generally to an information processing apparatus and a method of manufacturing the information processing apparatus.

BACKGROUND

A flexible printed circuit (FPC) may be used for connecting components inside an information processing apparatus such as a personal computer (PC). A notebook PC, for example, typically includes a housing in which a liquid crystal display (LCD) is provided and another housing in which a main board is provided. The main board includes a central processing unit (CPU) and a memory. A kind of notebook PC is provided with a camera at a position on the housing of the LCD side distant from the housing of the main board side. In the notebook PC including the camera, the camera and the main board may be connected to each other via the FPC. The FPC connecting the camera and the main board passes through the inside of the housing provided with the LCD.

In the notebook PCs, the housing is often made of a conductor such as magnesium. In order to improve characteristics of electromagnetic interference (EMI) in the FPC, a ground (GND) pattern of the FPC is connected to the housing on the LCD side. Conventionally, a GND pattern portion of the FPC is fixed to the housing with an adhesive tape to secure connection to the GND.

With regard to GND connection, there is known a conventional technique of connecting a transparent conductive film in the LCD body to a ground in a circuit board via the FPC. There is also known a conventional technique of holding a touch panel connected to the FPC with an LCD holder connected to the GND.

However, in the case of fixing the FPC with the adhesive tape, it is needed to prepare and handle the adhesive tape for fixing the FPC, so that the number of components is increased, and that the number of person-hours for assembly is also increased. Furthermore, at the time of disassembly, operation of peeling off the adhesive tape on the FPC is required, so that the number of person-hours at the time of disassembly is also increased. Additionally, in a case of roughly peeling off the adhesive tape on the FPC, large force is applied to a connection point between the FPC and the component, so that a failure such as that a terminal is bent may be caused.

SUMMARY

An information processing apparatus according to one or more embodiments includes: a housing that is made of a conductor; a display that is fitted into and fixed to the housing; one or more display support members that are disposed between the display and the housing, the one or more display support members including a display support member that is provided with a bonding region on part of a surface of the display support member, the surface being in contact with the housing, and fixed to the housing via a bonding member placed on the bonding region; and a flexible circuit board that includes a grounding pattern, the flexible circuit board being disposed such that the grounding pattern is in contact with the housing at a non-bonding region other than the bonding region on the surface of the display support member, part of the flexible circuit board, which includes the grounding pattern, being held between the display support member and the housing.

A method of manufacturing an information processing apparatus according to one or more embodiments includes: performing a process of disposing a flexible circuit board including a grounding pattern in a housing made of a conductor such that the grounding pattern is in contact with the housing; performing a process of disposing a display support member such that part of the flexible circuit board including the grounding pattern is sandwiched between the housing and a non-bonding region of the display support member, the display support member including a contact surface with which the housing is in contact, the non-bonding region being a region other than a bonding region provided on part of the contact surface of the display support member, and fixing the display support member to the housing via a bonding member placed on the bonding region; performing a process of fitting a display into the housing from a side of the housing, on which the display support member is disposed, to sandwich the display support member between the housing and the display.

This results in improved workability for assembly and disassembly of an information processing apparatus.

BRIEF DESCRIPTION OF THE DRAWINGS

FIG. 8 is a flowchart of a process of attaching the LCD for the notebook PC according to one or more embodiments.

DETAILED DESCRIPTION

The following describes embodiments of an information processing apparatus and a method of manufacturing the information processing apparatus disclosed herein in detail with reference to the drawings. The information processing apparatus and the method of manufacturing the information processing apparatus disclosed herein are not limited to the embodiments described below.

Figure 1:
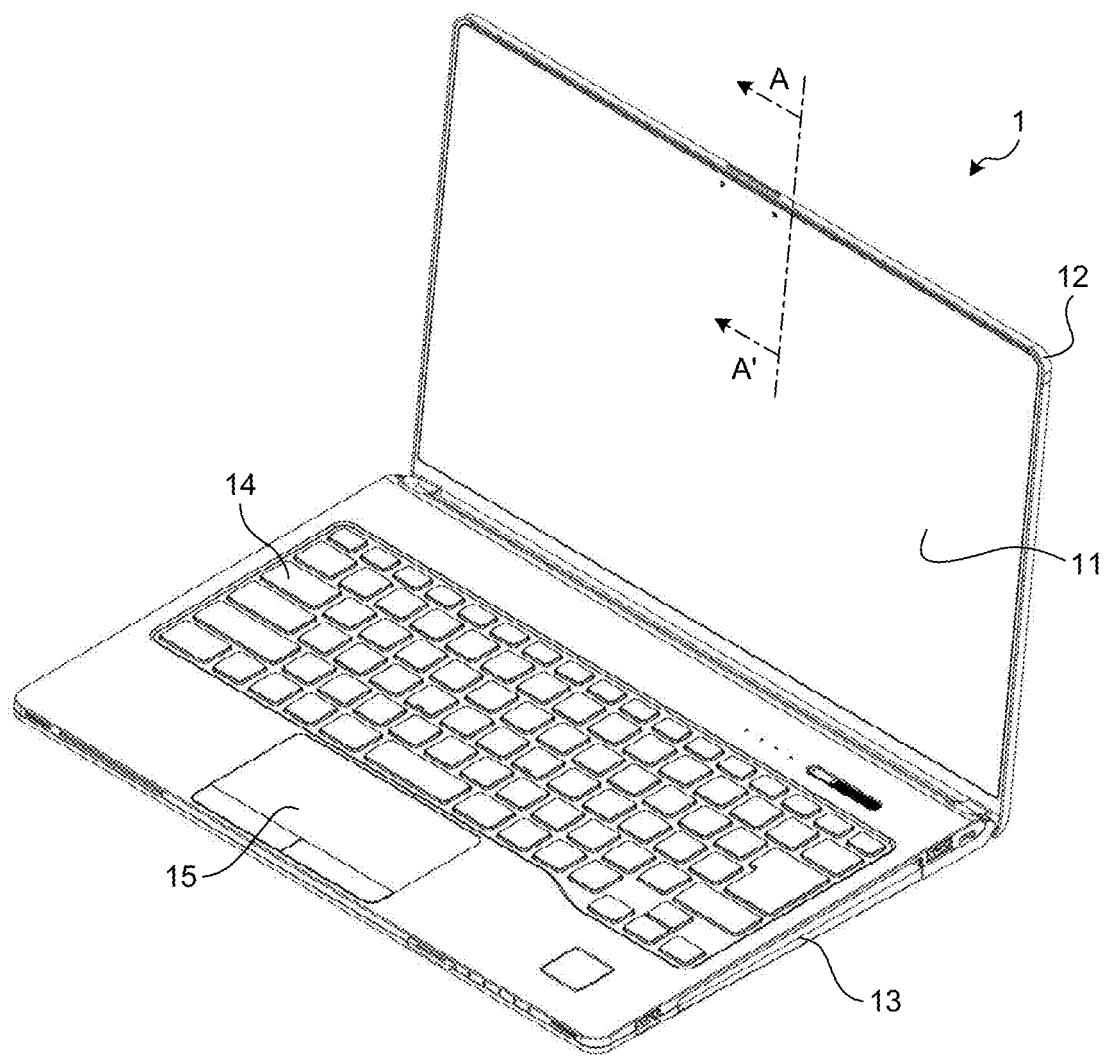
FIG. 1 is a perspective view of a notebook PC.

FIG. 1 is a perspective view of a notebook PC. As illustrated in FIG. 1, a housing of a notebook PC 1 include two portions, that is, a housing 12 in which an LCD 11 is provided, and a housing 13 in which a keyboard 14, a touch pad 15, and the like are provided. In the housing 13, a main board including a CPU and a memory mounted thereon, a hard disk, and the like are arranged. The LCD 11 is fixed to the housing 12 in a state of being fitted into the housing 12.

Figure 2:
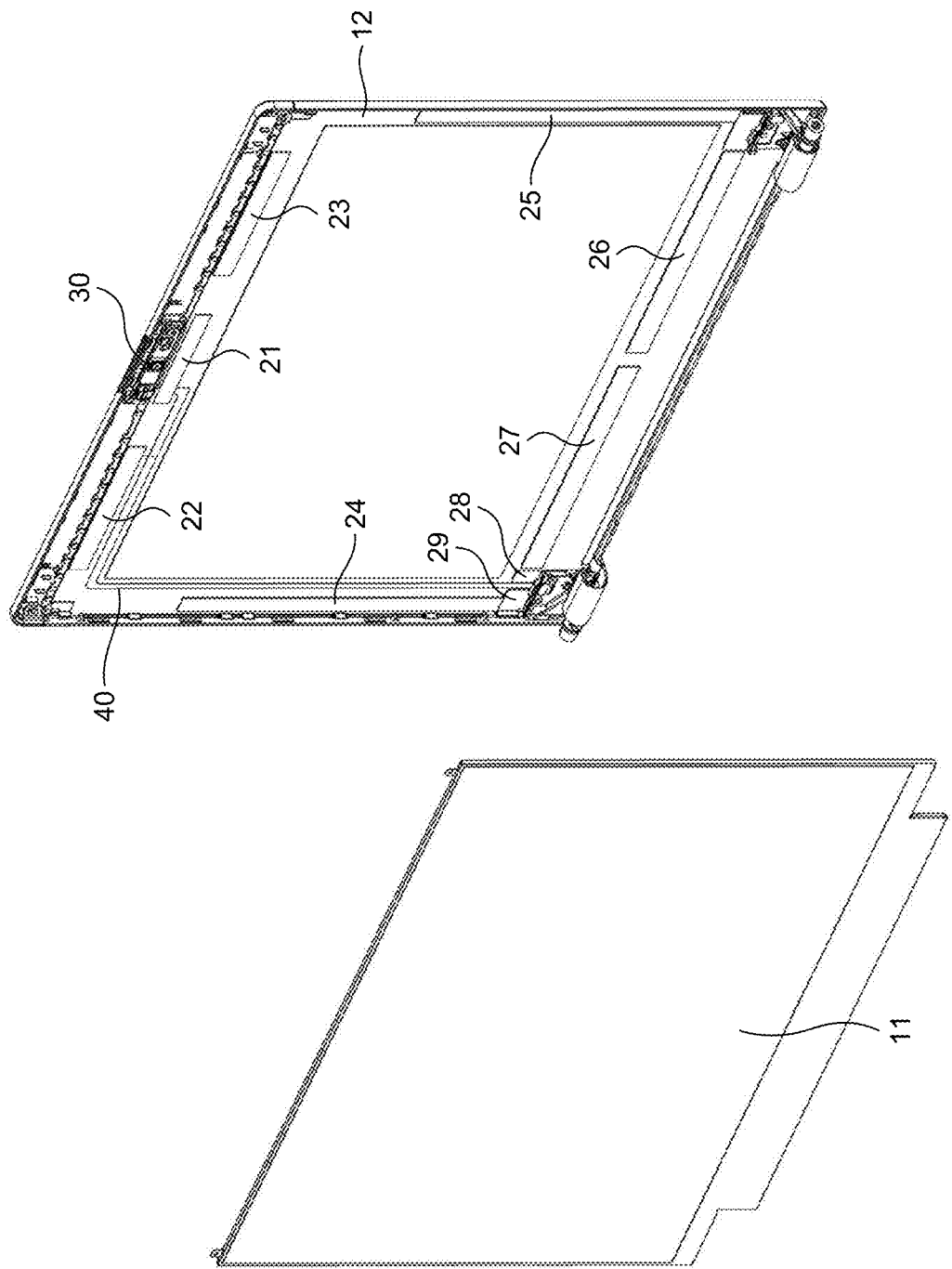
FIG. 2 is a perspective view of an LCD in a state of being disassembled from a housing on the LCD side.

FIG. 2 is a perspective view of the LCD in a state of being disassembled from the housing on the LCD side. After separating the housing 12 from the housing 13 of the notebook PC 1 in FIG. 1, the state illustrated in FIG. 2 is obtained by removing the LCD 11 from the housing 12. The LCD 11 is an example of a "display". The display is not limited to the LCD, and may be, for example, another type of display such as an organic electroluminescence (EL) display.

Figure 3:
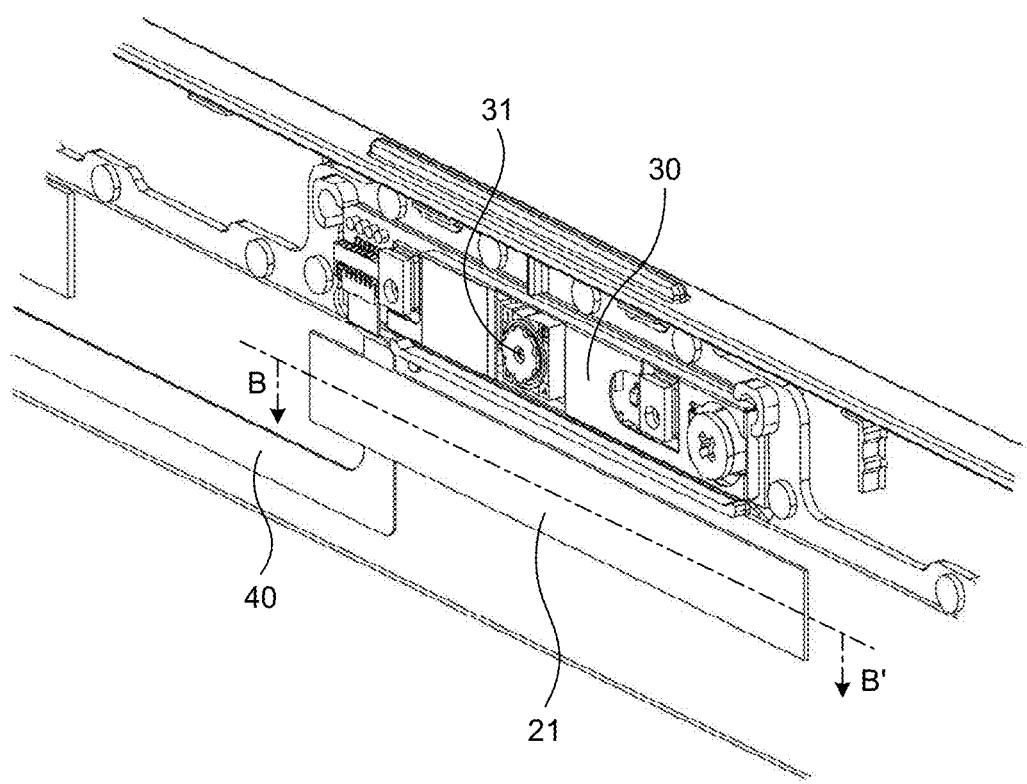
FIG. 3 is an enlarged view of a vicinity of a camera.

The housing 12 is made of a conductive material such as magnesium. A camera 30 is placed in the vicinity of an edge of the housing 12 on the opposite side of a side connected to the housing 13. FIG. 3 is an enlarged view of the vicinity of the camera. The camera 30 includes a lens 31 and an imaging mechanism.

Returning to FIG. 2, the description will be continued. An FPC 40 ("flexible circuit board") is a substrate that connects the camera 30 with a main board provided inside the housing 13. The FPC 40 is wired from the camera 30 to an edge connected to a main body. In one or more embodiments, the FPC 40 is wired to pass through adjacent to an edge of the LCD 11 so that a screen of the LCD 11 will not be affected thereby.

Alternatively, for preventing the FPC 40 from affecting the screen, when providing such a treatment that a member having a thickness equivalent to that of the FPC 40 is provided on the back of the LCD 11 corresponding to a portion other than the FPC 40, the FPC 40 may be disposed across the LCD 11. In this case, the length of the FPC 40 can be suppressed, and the EMI characteristics of the FPC 40 can be improved.

In the housing 12, LCD support members 21 to 29 ("display support members") are disposed for making a space between the LCD 11 and the housing 12 in a state that the LCD 11 is fitted into the housing 12. Each of the LCD support members 21 to 29 is a sponge member, and made of urethane material such as PORON. However, other materials having a cushioning property may be used for the LCD support members 21 to 29, for example, soft rubber and the like may be used.

The LCD support members 21 to 29 are disposed at positions other than the vicinity of the center of the LCD 11. Specifically, the LCD support members 21 to 29 are disposed adjacent to the edge of the LCD 11.

Figure 4:
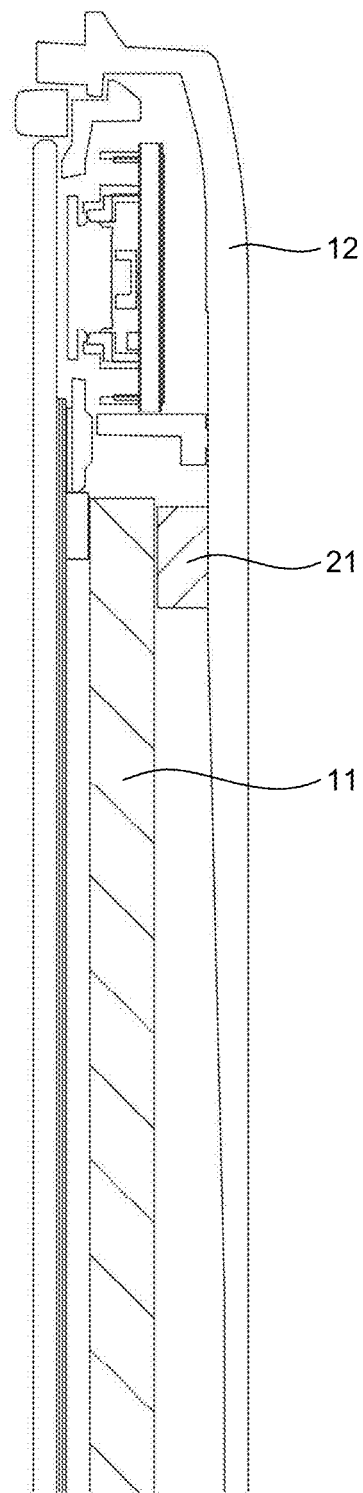
FIG. 4 is an A-A' cross-sectional view relating to FIG. 1.

In this case, when the vicinity of the center of the LCD 11 is somehow brought into contact with the housing 12 while the LCD 11 is fitted into the housing 12, the vicinity of the center of the LCD 11 is pressed, and a ripple comes up to a liquid crystal portion of the LCD 11. Thus, the LCD support members 21 to 29 are disposed adjacent to the edge of the LCD 11. FIG. 4 is an A-A' cross-sectional view. That is, FIG. 4 illustrates an A-A' cross section of the notebook PC 1 in FIG. 1. Although FIG. 4 illustrates a state in which the LCD support member 21 is in contact with the LCD 11, the LCD support members 22 to 29 are also in contact with the LCD 11. By supporting the LCD 11 by the LCD support members 21 to 29, a space is formed between the housing 12 and the LCD 11 to prevent the housing 12 from being pressed and brought into contact with the LCD 11.

Returning to FIG. 2, the description will be continued. A double-sided adhesive tape is attached to the entire surface of each of the LCD support members 22 to 27 being in contact with the housing 12. The LCD support members 22 to 27 are bonded and fixed to the housing 12 by the double-sided adhesive tape.

Figure 5:
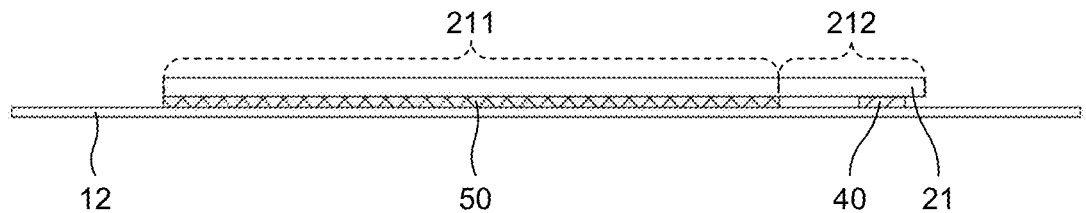
FIG. 5 is a B-B' cross-sectional view relating to FIG. 3.

Next, the following describes a bonding state of the LCD support member 21 in detail with reference to FIG. 5. FIG. 5 is a B-B' cross-sectional view. That is, FIG. 5 illustrates a B-B' cross section of the vicinity of the camera 30 in FIG. 3.

As illustrated in FIG. 5, a double-sided adhesive tape 50 is attached to part of the surface of the LCD support member 21 being in contact with the housing 12, and the LCD support member 21 is bonded and fixed to the housing 12 via the double-sided adhesive tape 50. In one or more embodiments, the double-sided adhesive tape 50 covers an entire region from one side of a surface of the LCD support member 21 being in contact with the housing 12 to a middle point between the one side and the opposite side. In the following description, a region of the surface of the LCD support member 21 being in contact with the housing 12, to which the double-sided adhesive tape 50 is attached, is referred to as a bonding region 211. A region of the surface of the LCD support member 21 being in contact with the housing 12, to which the double-sided adhesive tape 50 is not attached, is referred to as a non-bonding region 212. The non-bonding region 212 is a region including one side of the surface of the LCD support member 21 being in contact with the housing 12 and both sides of the one side, that is, a region including an end part of the surface of the LCD support member 21 being in contact with the housing 12.

As illustrated in FIG. 3 and FIG. 5, part of the FPC 40 is sandwiched between the non-bonding region 212 of the LCD support member 21 and the housing 12. The sandwiched part of the FPC 40 at the non-bonding region 212 is provided with a GND pattern ("grounding pattern"). The FPC 40 is disposed such that the GND pattern faces the housing 12 in order to be in contact with the housing 12.

While the LCD 11 is fitted into the housing 12, the LCD support member 21 receives pressing force from the LCD 11 toward the housing 12, and thereby presses the FPC 40 against the housing 12 at the non-bonding region 212. As a result, since the GND pattern on the FPC 40 is in contact with the housing 12 having conductivity, and the FPC 40 can secure the GND.

The LCD support member 21 is pressed by the LCD 11 against the housing 12, and the LCD support member 21 thereby securely presses the FPC 40 against the housing 12. For deriving this interaction, the thickness of the double-sided adhesive tape 50 is equal to or smaller than the thickness of the FPC 40. The thicknesses of the double-sided adhesive tape 50 and the FPC 40 indicate distances in a direction from the housing 12 toward the LCD support member 21. By setting the thickness of the double-sided adhesive tape 50 to be equal to or smaller than the thickness of the FPC 40, when the LCD support member 21 is pressed by the LCD 11, the FPC 40 receives the force from the LCD support member 21 before the force is applied to the double-sided adhesive tape 50 by the LCD support member 21. Accordingly, the FPC 40 is securely held between the LCD support member 21 and the housing 12, and can always secure the GND.

In one or more embodiments, although the LCD support member 21 is bonded to the housing 12 via the double-sided adhesive tape 50 as a bonding member by way of example, a bonding method is not limited thereto. For example, a bonding agent may be applied to the bonding region 211 of the LCD support member 21 to be bonded to the housing 12. Note that, as described above, the thickness of the bonding member is equal to or smaller than the thickness of the FPC 40.

Figure 6:
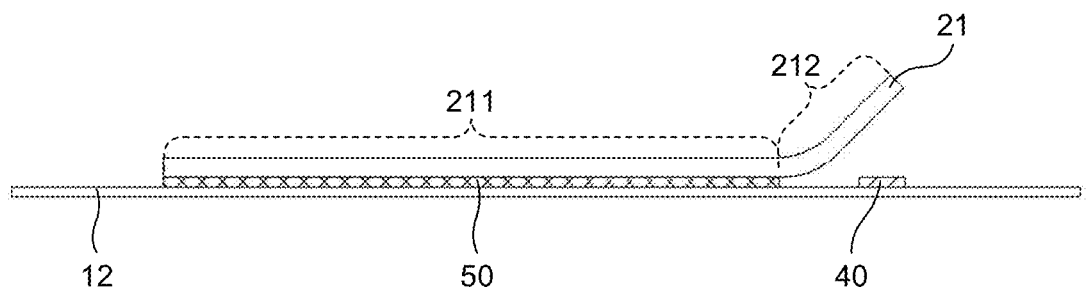
FIG. 6 is a diagram illustrating a state in which an LCD support member is lifted up.

FIG. 6 is a diagram illustrating a state in which the LCD support member is lifted up. The non-bonding region 212 of the LCD support member 21 according to one or more embodiments is a region including one side of the surface of the LCD support member 21 being in contact with the housing 12 and both sides of the one side. Thus, the end part of the LCD support member 21 can be lifted up as illustrated in FIG. 6 while the LCD 11 is removed from the housing 12.

In a case of removing the FPC 40 at the time of disassembling the notebook PC 1, the FPC 40 can be easily removed by lifting up the end part of the LCD support member 21 as illustrated in FIG. 6. The LCD support member 21 is an example of a "display support member".

Figure 7:
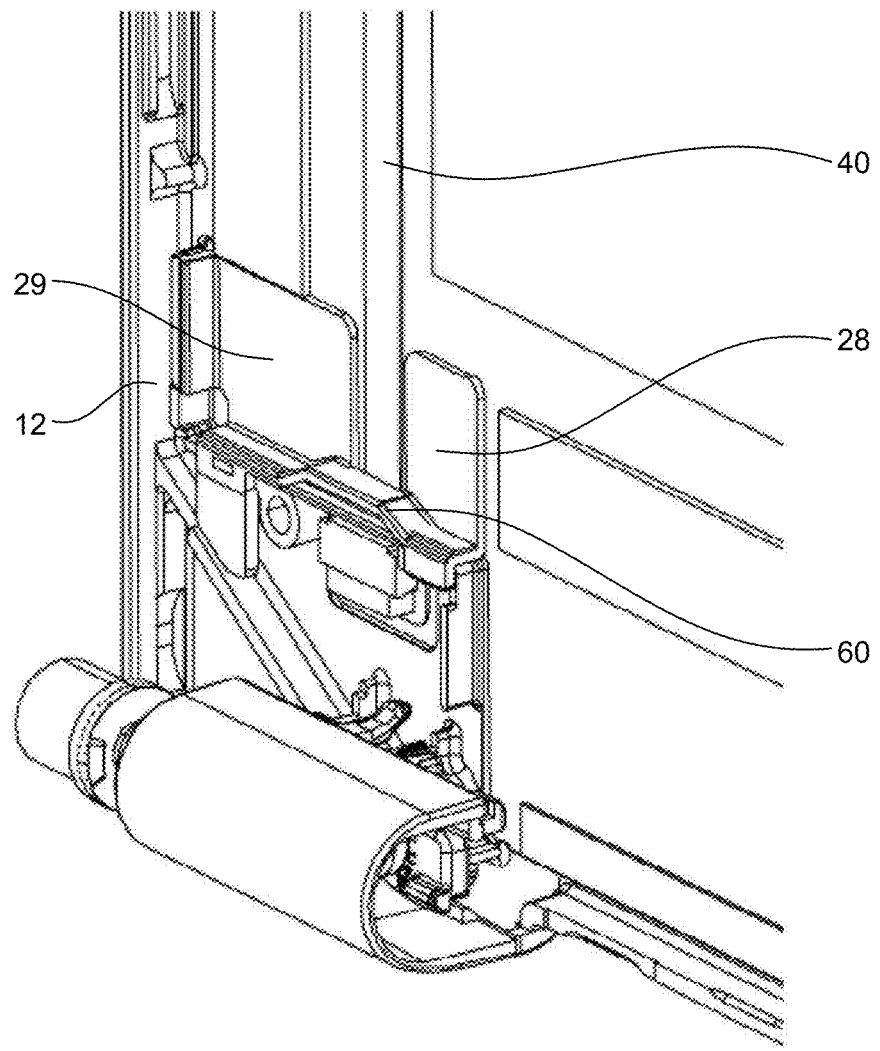
FIG. 7 is an enlarged view of a connection side of an FPC with respect to a main board.

FIG. 7 is an enlarged view of a connection side of the FPC with respect to the main board. The LCD support members 29 and 28 according to one or more embodiments are arranged on both sides of the FPC 40 as shown in FIG. 7. The LCD support members 29 and 28 are connected to each other via a coupling member 60.

The double-sided adhesive tape is placed on the entire surface of the LCD support member 29 being in contact with the housing 12. The entire surface of the LCD support member 29 being in contact with the housing 12 via the double-sided adhesive tape is bonded and fixed to the housing 12. The LCD support member 29 is bonded to the housing 12 to fix the coupling member 60 connected thereto to the housing 12.

On the other hand, the double-sided adhesive tape is not placed on a surface of the LCD support member 28 being in contact with the housing 12. Thus, the LCD support member 28 is not bonded to the housing 12. The LCD support member 28 is held by the coupling member 60 fixed to the LCD support member 29, and thereby the position of the LCD support member 28 to the housing 12 is fixed.

The LCD support member 28 is not bonded to the housing 12, so that the LCD support member 28 can be lifted up by utilizing flexibility of the coupling member 60. Thus, in a case of removing the FPC 40 at the time of disassembling the notebook PC 1, the FPC 40 can be easily removed by lifting up the LCD support member 28 and the coupling member 60.

The coupling member 60 presses the FPC 40 against the housing 12. The GND pattern is provided at part of the FPC 40 to be pressed against the housing 12 by the coupling member 60. That is, the FPC 40 can secure the GND by being pressed against the housing 12 by the coupling member 60.

Next, the following describes a process of attaching the LCD 11 for the notebook PC 1 according to one or more embodiments. FIG. 8 is a flowchart of the process of attaching the LCD for the notebook PC according to one or more embodiments.

The FPC 40 is disposed on part of the housing 12 corresponding to the edge of the LCD 11 such that the GND pattern is in contact with the housing 12 at the non-bonding region 212 of the LCD support member 21 (Step S1).

The LCD support member 21 is disposed such that the GND pattern portion of the FPC 40 is sandwiched between the housing 12 and the non-bonding region 212 of the LCD support member 21, and bonded and fixed to the housing 12 by the double-sided adhesive tape 50 placed on the bonding region 211 (Step S2). The LCD support members 22 to 29 are disposed on individual parts of the housing 12 corresponding to the vicinity of the edge of the LCD 11.

The LCD 11 is fitted into the housing 12 while causing the LCD 11 to abut on the LCD support members 21 to 29, and thereby the LCD support member 21 is sandwiched between the LCD 11 and the housing 12 (Step S3).

The embodiments described above are exemplified by the FPC 40 connecting the main board with the camera 30. Alternatively, another structure may be employed so long as the FPC 40 passes through between the LCD 11 and the housing 12. For example, the GND may be secured by fixing the FPC 40 connecting the main board with an antenna for a wireless local area network (LAN) disposed in the vicinity of an edge of the housing 12 opposite to the side connected to the housing 13.

As described above, in the notebook PC according to one or more embodiments, the GND pattern portion of the FPC is held between the non-bonding region of the LCD support member and the housing to secure the GND for the FPC. In the notebook PC according to one or more embodiments, the adhesive tape for securing contact between the FPC and the housing is not used, so that the number of components can be reduced, and the number of person-hours for assembly can be reduced. In a case of disassembling the notebook PC according to one or more embodiments, the FPC can be easily removed by lifting up the end part of the LCD support member corresponding to the non-bonding region that holds the FPC. Therefore, the notebook PC according to one or more embodiments is capable of improving workability for assembly and disassembly.

Modification

In the embodiments explained above, the region including the end part of the LCD support member 21 is set as the non-bonding region 212. Alternatively, a region not including the end part, for example, a middle region of the LCD support member 21 between bonding regions 211 may be set as the non-bonding region 212.

Also in such the case, the GND pattern of the FPC 40 is provided at a position corresponding to the non-bonding region 212, and held between the non-bonding region 212 and the housing 12. According to this structure, the FPC 40 can secure the GND.

Also in the notebook PC according to the modification, the adhesive tape for securing contact between the FPC and the housing is not used, so that the number of components can be reduced, and the number of person-hours for assembly can be reduced. Additionally, in a case of disassembling the notebook PC according to the modification, the FPC can be removed by lifting up the non-bonding region of the LCD support member. This configuration can prevent occurrence of a failure caused when an adhesive tape is peeled off from the FPC that is attached to the housing by the adhesive tape. Therefore, the notebook PC according to the modification is also capable of improving workability for assembly and disassembly.

In the above description, the notebook PC is exemplified. Alternatively, any other information processing apparatus may be used so long as the information processing apparatus has a configuration such that the housing has electrical conductivity, the LCD support member is sandwiched between the LCD and the housing, and the GND pattern of the FPC wired inside the housing is in contact with the housing to secure the GND.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. An information processing apparatus comprising:
a conductive housing;
a display that is fitted into and fixed to the housing; one or more display support members that are disposed between the display and the housing, wherein the one or more display support members including a display support member that is:
provided with a bonding region on part of a surface of the display support member, that is in contact with the housing, and
fixed to the housing via a bonding member placed on the bonding region; and
a flexible circuit board that includes a grounding pattern, wherein the flexible circuit board is disposed such that the grounding pattern is in contact with the housing at a non-bonding region of the display support member other than the bonding region, and part of the flexible circuit board that includes the grounding pattern is held between the display support member and the housing.

2. The information processing apparatus according to claim 1, wherein the bonding member has a thickness equal to or smaller than a thickness of the part of flexible circuit board that includes the grounding pattern.

3. The information processing apparatus according to claim 1, wherein the non-bonding region is provided at an end part of the surface that is in contact with the housing.

4. The information processing apparatus according to claim 1, wherein each of the one or more display support members is disposed adjacent to an edge of the display.

5. The information processing apparatus according to claim 1, wherein the flexible circuit board is wired between the housing and disposed adjacent to the edge of the display.

6. A method of manufacturing an information processing apparatus, the method comprising:
disposing a flexible circuit board including a grounding pattern in a conductive housing such that the grounding pattern is in contact with the housing;
disposing a display support member such that part of the flexible circuit board including the grounding pattern is sandwiched between the housing and a non-bonding region of the display support member, wherein the display support member includes a contact surface with which the housing is in contact, and the non-bonding region is a region other than a bonding region provided on part of the contact surface of the display support member, and
fixing the display support member to the housing via a bonding member placed on the bonding region;
fitting a display into the housing from a side of the housing, on which the display support member is disposed, to sandwich the display support member between the housing and the display.

* * * * *